United States Patent
Fletcher et al.

(10) Patent No.: US 7,504,277 B2
(45) Date of Patent: Mar. 17, 2009

(54) METHOD FOR FABRICATING A HIGH PERFORMANCE PIN FOCAL PLANE STRUCTURE USING THREE HANDLE WAFERS

(75) Inventors: Christopher L. Fletcher, Santa Barbara, CA (US); Andrew G. Toth, Lompoc, CA (US)

(73) Assignee: Raytheon Company, Waltham, MA (US)

( * ) Notice: Subject to any disclaimer, the term of this patent is extended or adjusted under 35 U.S.C. 154(b) by 183 days.

(21) Appl. No.: 11/248,366

(22) Filed: Oct. 12, 2005

(65) Prior Publication Data

US 2007/0090418 A1    Apr. 26, 2007

(51) Int. Cl.
*H01L 21/00* (2006.01)
(52) U.S. Cl. .................... 438/57; 438/458; 438/459; 438/977; 257/458; 257/E31.061
(58) Field of Classification Search .............. 438/57, 438/458, 459, 977; 257/458, E31.061
See application file for complete search history.

(56) References Cited

U.S. PATENT DOCUMENTS

| 5,034,343 | A | * | 7/1991 | Rouse et al. ............... 438/400 |
| 5,330,918 | A | * | 7/1994 | Dubbelday et al. ........... 438/73 |
| 6,096,621 | A | * | 8/2000 | Jennings ................... 438/404 |
| 6,303,967 | B1 | * | 10/2001 | Irissou ..................... 257/406 |
| 6,323,054 | B1 | * | 11/2001 | Yaung et al. ................ 438/75 |
| 6,407,440 | B1 | * | 6/2002 | Rhodes ..................... 257/462 |
| 6,455,398 | B1 | * | 9/2002 | Fonstad et al. ............. 438/459 |
| 6,690,078 | B1 | | 2/2004 | Irissou et al. .............. 257/458 |
| 6,841,807 | B2 | * | 1/2005 | Kang ....................... 257/184 |
| 7,052,927 | B1 | * | 5/2006 | Fletcher et al. .............. 438/57 |
| 7,157,352 | B2 | * | 1/2007 | Yamanaka .................. 438/458 |
| 2002/0008280 | A1 | * | 1/2002 | Armacost et al. ........... 257/330 |
| 2005/0056862 | A1 | * | 3/2005 | Park ......................... 257/184 |
| 2005/0153121 | A1 | | 7/2005 | Barnji et al. .............. 250/492.2 |
| 2005/0186759 | A1 | * | 8/2005 | So ........................... 438/459 |
| 2006/0216846 | A1 | * | 9/2006 | Oi ............................. 438/48 |

OTHER PUBLICATIONS

International Search Report and Written Opinion, mailed Jul. 25, 2007, 8 pages.

* cited by examiner

*Primary Examiner*—Zandra Smith
*Assistant Examiner*—Sun M. Kim
(74) *Attorney, Agent, or Firm*—Leonard A. Alkov

(57) ABSTRACT

The present invention concerns, in part, a method for fabricating a silicon PIN detector component wherein three handle wafers are bonded to the wafer at varying points in the fabrication process. The utilization of three handle wafers during fabrication significantly ease handling concerns associated with what would otherwise be a relatively thin and fragile wafer, providing a stable and strong base for supporting those portions of the wafer that will constitute the PIN detector component. In a variant of the present invention, the third handle wafer comprises an optical element transparent in the wavelength of interest.

22 Claims, 9 Drawing Sheets

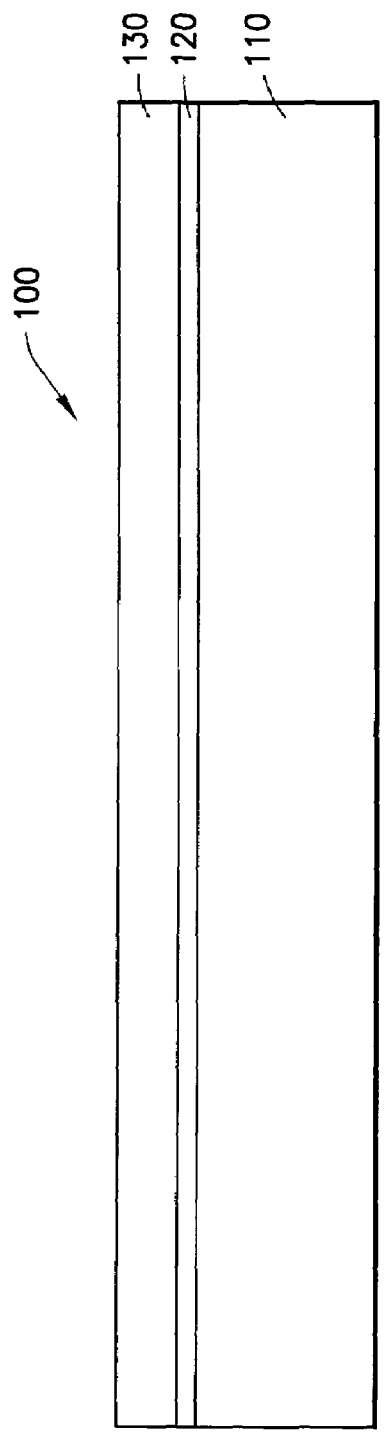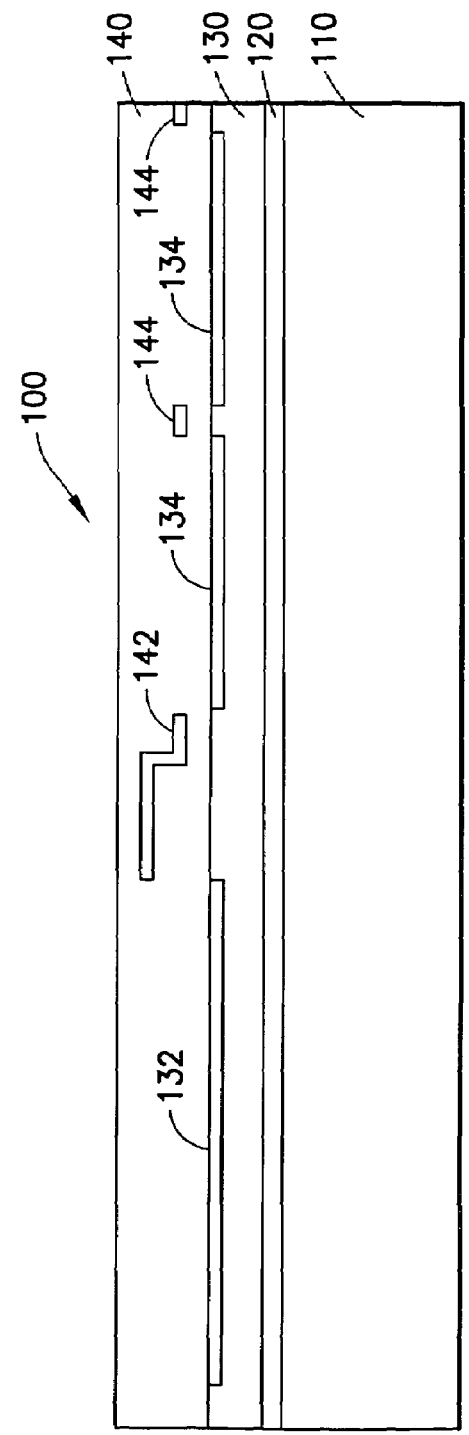

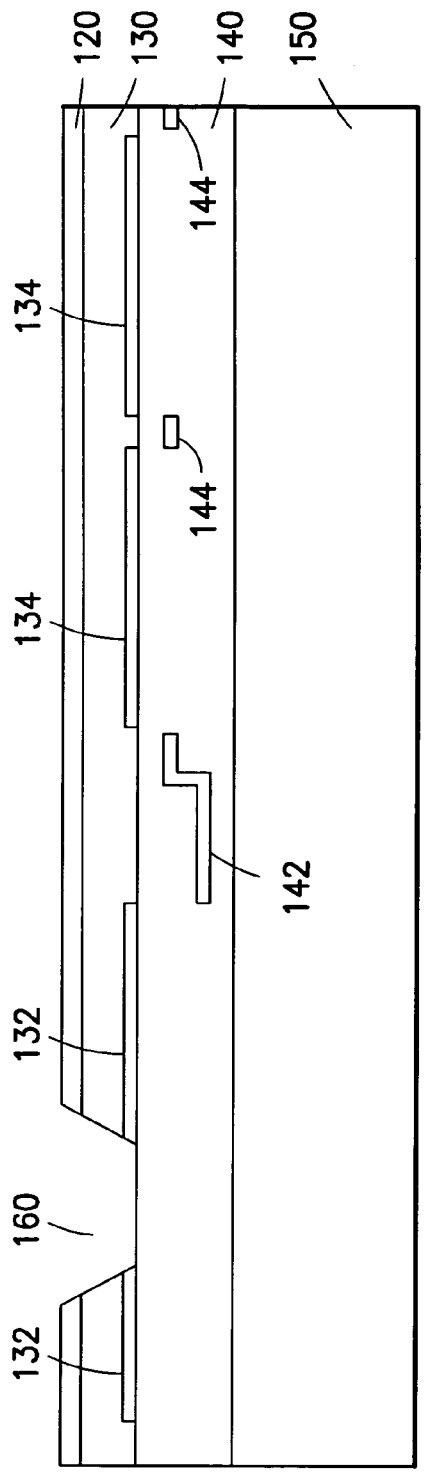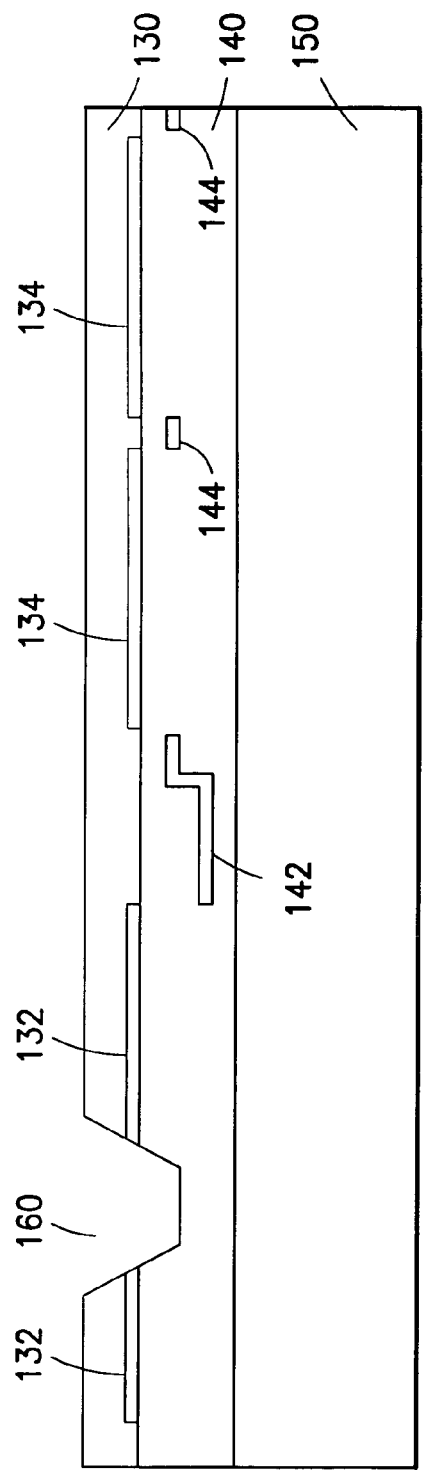

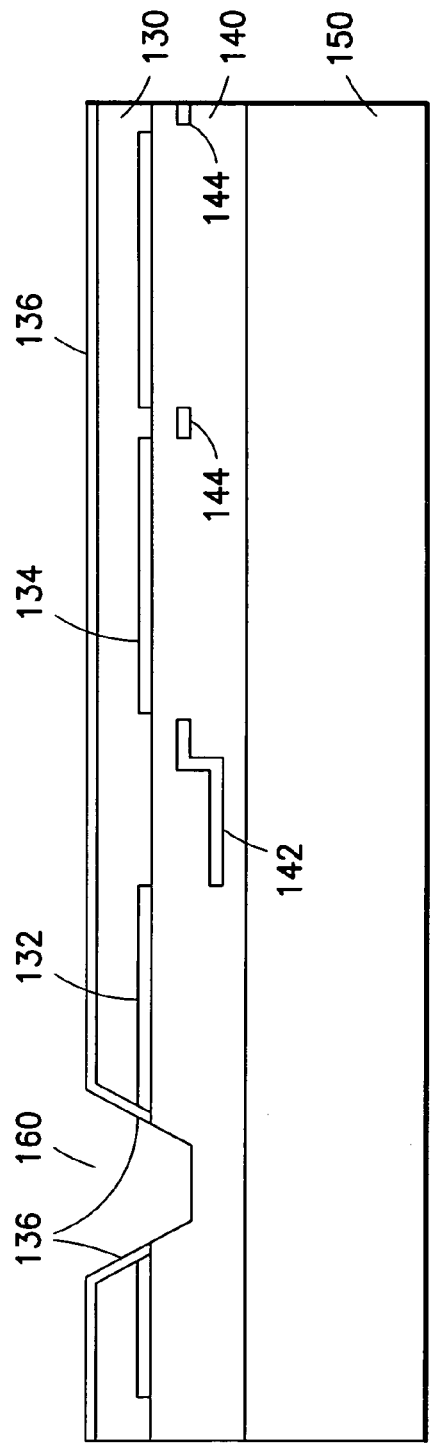
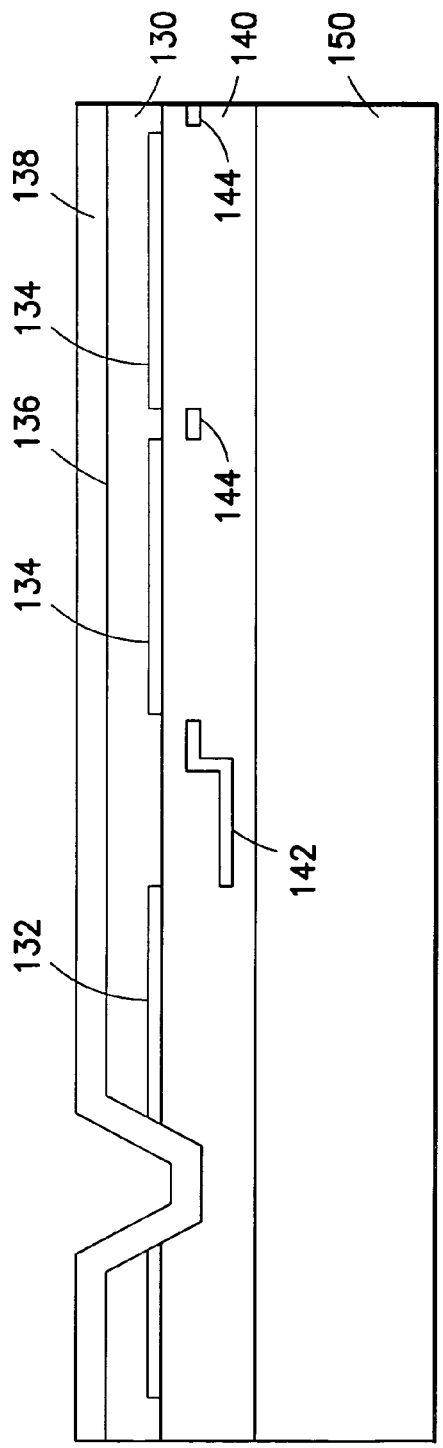
FIG. 7
FIG. 8

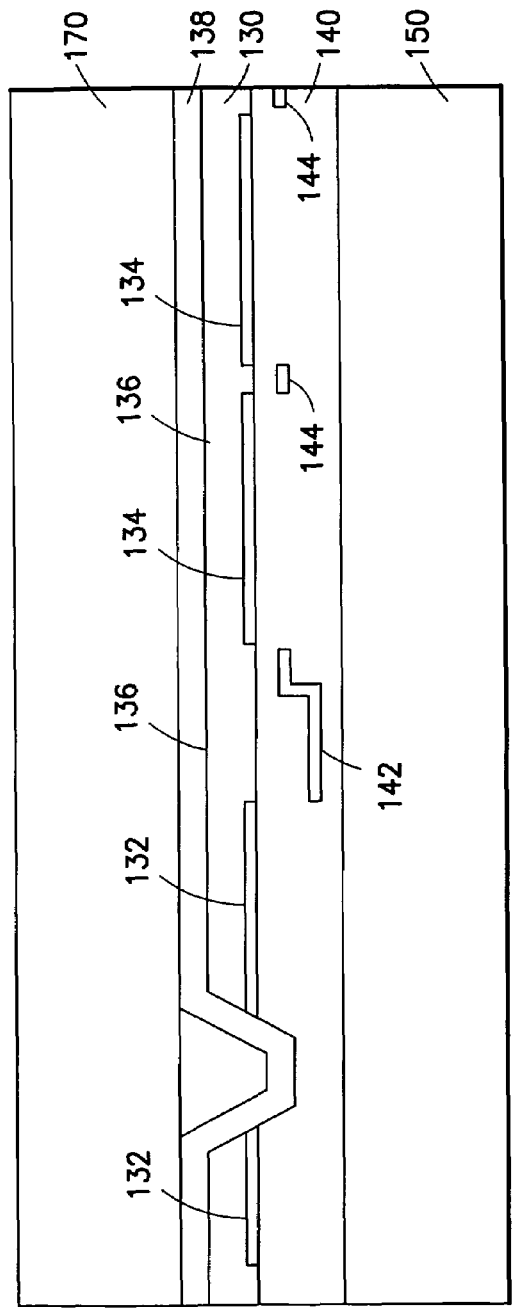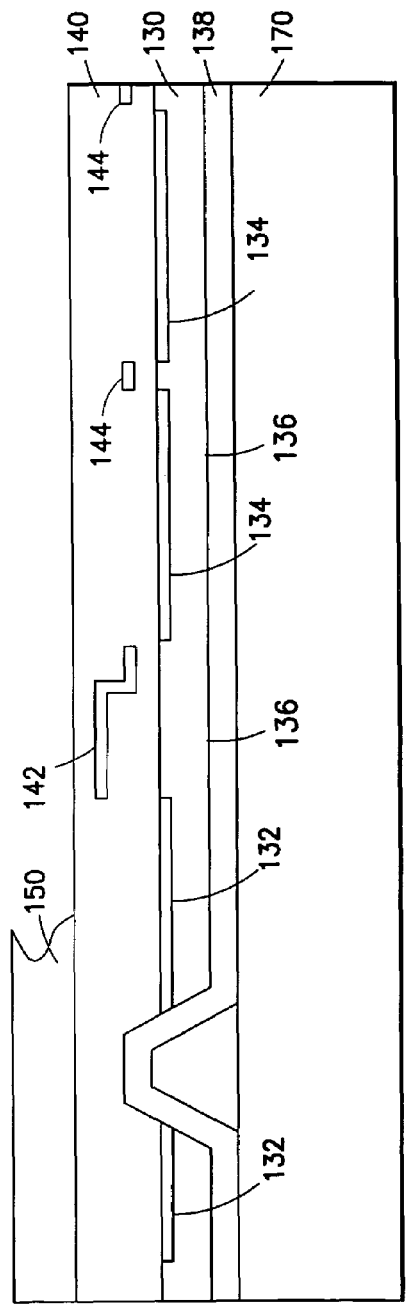
FIG.9
FIG.10

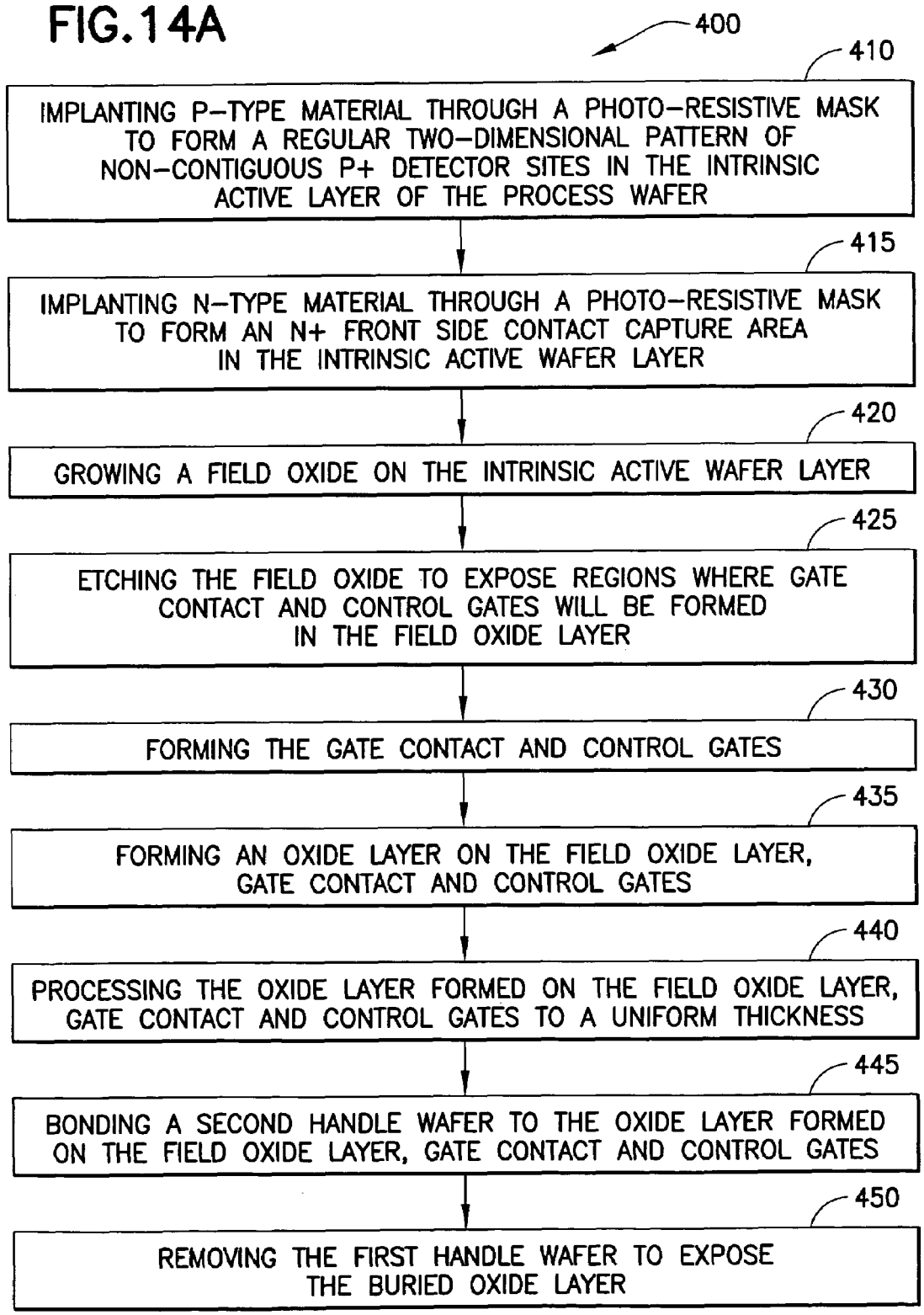

METHOD FOR FABRICATING A HIGH PERFORMANCE PIN FOCAL PLANE STRUCTURE USING THREE HANDLE WAFERS

TECHNICAL FIELD

The present invention generally concerns imaging sensors, and more particularly concerns fabrication methods and device structures for use with PIN (p-type/intrinsic/n-type) imaging sensors.

BACKGROUND

In the field of photosensitive imaging devices there is a desire for increased resolving capability, particularly where the imaging devices are incorporated in, e.g., surveillance systems or high-performance professional digital cameras. A practical benefit associated with increased resolution in surveillance systems is the ability to recognize a feature having relatively smaller dimensions in a given field of view. A practical benefit associated with increased resolution in high-performance professional digital cameras is the ability to enlarge photographs without obvious artifacts like pixilation.

One way of achieving improved resolution is to increase the number of picture elements (hereinafter "pixels") used to sense a given field of view. The decision to increase pixels, however, is not cost-free. For example, if the overall dimensions of the sensor element are held constant, more pixels with less detecting area per pixel will be used to image a given field of view. A typical consequence of this is an increase in the susceptibility of the imaging system to artifacts associated with noise, e.g., the blotchy appearance of shadowy areas in images of scenes where in the actual view the shadowy areas were of relatively uniform illumination.

Another approach which can maintain a desired noise performance is to hold the individual pixel size constant, but to increase the overall dimensions of the imaging sensor. This also has negative consequences. In particular, such an approach will require fabrication in semi-conductor materials of larger imaging sensors typically accompanied by lower yields. Thus the imaging sensor will be more expensive. In addition, if the imaging sensor is used in combination with optics, e.g., a zoom lens, the optical elements comprising the zoom lens, and the overall size of the zoom lens will have to be larger to maintain the same field of view.

It is not surprising that given these constraints a hybrid approach is often pursued, i.e., the overall dimensions of the imaging sensor are increased while reducing somewhat the dimensions of the pixels. Nonetheless, even in compromise situations the same problems are encountered, e.g., susceptibility to noise and increased fabrication expense.

Problems are also encountered in the selection of imaging sensor technology, e.g., PIN, active PN or CCD, as each of these have their own respective problems as the size of the pixel comprising the imaging sensor decreases. For example, in active PN devices a portion of the pixel actually comprises non-photo-sensitive control circuitry. As the size of pixels decrease for a constant imaging sensor dimension, the control circuitry becomes a larger percentage of the device area, eventually to the point where noise effects become intolerable.

In environments where radiation events are possible, non-optical issues have to be taken into consideration. Different imaging sensor technologies have different radiation hardness properties, and these hardness properties, if desirable, should not be sacrificed if the pixel size is decreased in an effort to increase resolution.

Designing the imaging sensor to have desirable radiation hardness properties may also cause unforeseen and unappreciated problems. For example, certain device features are more susceptible to radiation effects if their overall dimensions are larger, so there is a natural desire to decrease the dimensions of these device features. The decrease in device dimensions may, e.g., drive the sensor thickness to dimensions that are difficult to fabricate using conventional fabrication methods.

Thus, those skilled in the art desire new imaging sensor designs that have improved resolution with desirable noise and radiation hardness properties. Those skilled in the art also desire fabrication methods that are capable of economically making new imaging sensors with desirable properties by achieving acceptable yield levels. Those skilled in the art further desire designs and methods that are particularly applicable to PIN imaging sensors.

SUMMARY OF THE PREFERRED EMBODIMENTS

The foregoing and other problems are overcome, and other advantages are realized, in accordance with the presently preferred embodiments of these teachings.

A first embodiment of the present invention comprises a method for fabricating a PIN focal plane imaging sensor detector component comprising: fabricating a process wafer comprising an n-type first handle layer; an intrinsic active layer; and a buried oxide layer between the n-type handle layer and the intrinsic active layer, wherein an exposed surface of the intrinsic active layer coincides with a first processing side of the process wafer; forming an N+ front side contact capture area and P+ detector circuitry in the intrinsic active layer on the first processing side of the process wafer and associated structures in a second oxide layer atop the intrinsic active layer of the process wafer; bonding a second handle wafer to the first processing side of the process-wafer by bonding the second handle wafer to the second oxide layer atop the intrinsic active layer; removing the first handle wafer layer to expose the buried oxide layer, wherein the surface of the buried oxide layer exposed by removal of the first handle wafer coincides with a second processing side of the process wafer; forming a backside contact region on the second processing side of the process wafer, during which the buried oxide layer and a portion of the intrinsic active layer above the N+ front side contact capture area is removed thereby exposing a surface of the active intrinsic layer and a portion of the N+ front side capture area; implanting N+ species in the exposed surface of the active intrinsic layer to form an N+ region, whereby the N+ region forms an electrical contact with the N+ front side contact capture area; bonding a third handle wafer to the second processing side of the process wafer; removing the second handle wafer to expose the second oxide layer, wherein the surface of the second oxide layer exposed by removal of the second handle wafer coincides with the first processing side of the process wafer; and forming metal contacts the first processing side of the process wafer with the N+ front side contact capture area; P+ detectors and associated structures.

A second embodiment of the present invention comprises a PIN focal plane imaging sensor detector component created by a process comprising: fabricating a process wafer comprising an n-type first handle layer; an intrinsic active layer; and a buried oxide layer between the n-type handle layer and the intrinsic active layer, wherein an exposed surface of the intrinsic active layer coincides with a first processing side of the process wafer; forming an N+ front side contact capture area and P+ detector circuitry in the intrinsic active layer on the first processing side of the process wafer and associated structures in a second oxide layer atop the intrinsic active layer of the process wafer; bonding a second handle wafer to the first processing side of the process wafer by bonding the second handle wafer to the second oxide layer atop the intrinsic active layer; removing the first handle wafer layer to expose the buried oxide layer, wherein the surface of the buried oxide layer exposed by removal of the first handle wafer coincides with a second processing side of the process wafer; forming a backside contact region on the second processing side of the process wafer, during which the buried oxide layer and a portion of the intrinsic active layer above the N+ front side contact capture area is removed thereby exposing a surface of the active intrinsic layer and a portion of the N+ front side capture area; implanting N+ species in the exposed surface of the active intrinsic layer, whereby the N+ region forms an electrical contact with the N+ front side contact capture area; bonding a third handle wafer to the second processing side of the process wafer; removing the second handle wafer to expose the second oxide layer, wherein the surface of the second oxide layer exposed by removal of the second handle wafer coincides with the first processing side of the process wafer; and forming metal contacts on the first processing side of the process wafer with the N+ front side contact capture area; P+ detectors and associated structures; and wherein the combined overall thickness of the PIN imaging sensor is less than 30 microns.

A third embodiment of the present invention comprises a method for processing a three-layer process wafer to form a PIN imaging device detector component using three handle wafers, the three-layer process wafer comprising a first handle wafer of N-type material, an intrinsic active layer, and a buried oxide layer positioned between the first handle wafer and the intrinsic active layer, the method comprising: implanting. P-type material though a photo-resistive mask to form a regular two-dimensional pattern of non-contiguous P+ detector sites in the intrinsic active layer of the process wafer; implanting N-type material through a photo-resistive mask to form an N+ front side contact capture area in the intrinsic active layer; growing a field oxide on the intrinsic active layer; etching the field oxide to expose regions where gate contact and control gates will be formed in the field oxide; forming the gate contact and control gates; forming an oxide layer on the field oxide layer, gate contact and control gates; processing the oxide layer formed on the field oxide layer, gate contact and control gates to a uniform thickness; bonding a second handle wafer to the oxide layer formed on the field oxide layer, gate contact and control gates; removing the first handle wafer to expose the buried oxide layer; etching a cavity in the buried oxide layer, the intrinsic active layer and the N+ front side contact capture area; removing the remaining buried oxide layer, thereby exposing a surface of the intrinsic. active layer; implanting N+ species in the exposed surface of the intrinsic active layer to form an N+ region, whereby the N+ region forms an electrical contact with the N+ front side contact capture area; bonding a third handle wafer to the process wafer; removing the second handle wafer to expose the field oxide layer; etching the field oxide layer through a photoresistive mask where metal contacts will be formed; and forming metal contacts with the N+ front side contact capture area; gate contacts and P+ detector sites in the etched areas.

A fourth embodiment of the present invention comprises a PIN imaging sensor detector component for imaging a field of view by detecting electromagnetic radiation emanating from the field of views the PIN imaging sensor comprising: an oxide layer having a first surface and a second surface; an intrinsic layer positioned atop the first surface of the oxide layer, wherein the intrinsic layer has a first surface in contact with the oxide layer, and a second surface facing the field of view, wherein electromagnetic radiation emanating from the field of view impinges on the second surface of the intrinsic layer, the intrinsic layer having at least one channel formed in the periphery of the imaging sensor wherein intrinsic material has been removed to expose a portion of the oxide layer, the at least one channel having sides; a plurality of non-contiguous P+ regions formed in the intrinsic layer at the first surface of the intrinsic layer, wherein the P+ regions extend partially into the intrinsic layer at a substantially uniform depth, the plurality of P+ regions arrayed in a substantially uniform two-dimensional array of rows and columns; a plurality of non-contiguous buried N+ regions formed in the intrinsic layer at the first surface of the intrinsic layer and adjacent to the channel, the N+ region comprising a portion of the side of the channel; an exposed N+ region formed in the second surface of the intrinsic layer and extending partially into the intrinsic layer, the exposed N+ region extending down the side of the channel and contacting the buried N+ regions, wherein the exposed N+ region, plurality of P+ regions and the intrinsic material between the P+ and exposed N+ regions together form a plurality of detector sites for detecting electromagnetic radiation emanating from the field of view; metal contacts extending through the oxide layer from the second surface of the oxide layer and contacting the buried N+ and P+ regions; and wherein the combined overall thickness of the PIN imaging sensor is less than 30 microns.

Thus it is seen that the apparatus and method of the present invention provide a PIN imaging sensor detector component with improved characteristics. In particular, the method of the present invention enables PIN imaging sensors to be constructed with smaller detector sites while achieving desirable resistance to noise and radiation events. The desired resistance to noise and radiation is achieved, in part, by reducing the thickness of the PIN-type imaging sensor. The reduced thickness of the PIN-type imaging sensor is achieved by utilizing a fabrication method that uses three handle wafers at varying stages of the fabrication process. With this fabrication process, overall imaging sensor thickness can be reduced to 30 microns or less when operating as a photovoltaic detector or as an avalanche photodiode (APD). This decrease in imaging sensor thickness has the desirable effects of reducing the susceptibility of the imaging sensor to noise and radiation events.

In conclusion, the foregoing summary of the embodiments of the present invention is exemplary and non-limiting. For example, one skilled in the art will understand that one or more aspects or steps from one embodiment can be combined with one or more aspects or steps from another embodiment of the present invention to create a new embodiment within the scope of the present invention.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIG. 1 depicts in a cross-sectional view a three-layer process wafer;

FIG. 2 depicts in a cross-sectional view the process wafer of FIG. 1 after steps in which a front side contact capture area for the detector backside contact, gate contact area and control gates have been formed in various layers of the wafer on a first processing side of the wafer, all in accordance with embodiments of the invention;

FIG. 5 depicts the results of steps in which a backside contact profile is formed in a second processing side of the wafer of FIG. 4, all in accordance with embodiments of the invention;

FIG. 6 depicts the results of steps in which a buried oxide layer is removed from the wafer of FIG. 5 and the field oxide layer has been etched in the region of the backside contact, all in accordance with embodiments of the invention;

FIG. 7 depicts the results of steps in which backside contact areas have been formed in the wafer of FIG. 6 by implantation of N+ species, all in accordance with embodiments of the invention;

FIG. 8 depicts the results of steps in which a bonding oxide layer has been formed in the process wafer depicted in FIG. 7, all in accordance with embodiments of the invention;

FIG. 9 depicts the results of steps in which a third handle wafer has been bonded to the process wafer depicted in FIG. 8, all in accordance with embodiments of the invention;

FIG. 10 depicts a step in which the second handle wafer is removed from the process wafer depicted in FIG. 9, all in accordance with embodiments of the invention;

DETAILED DESCRIPTION OF THE PREFERRED EMBODIMENTS

Figure 3:
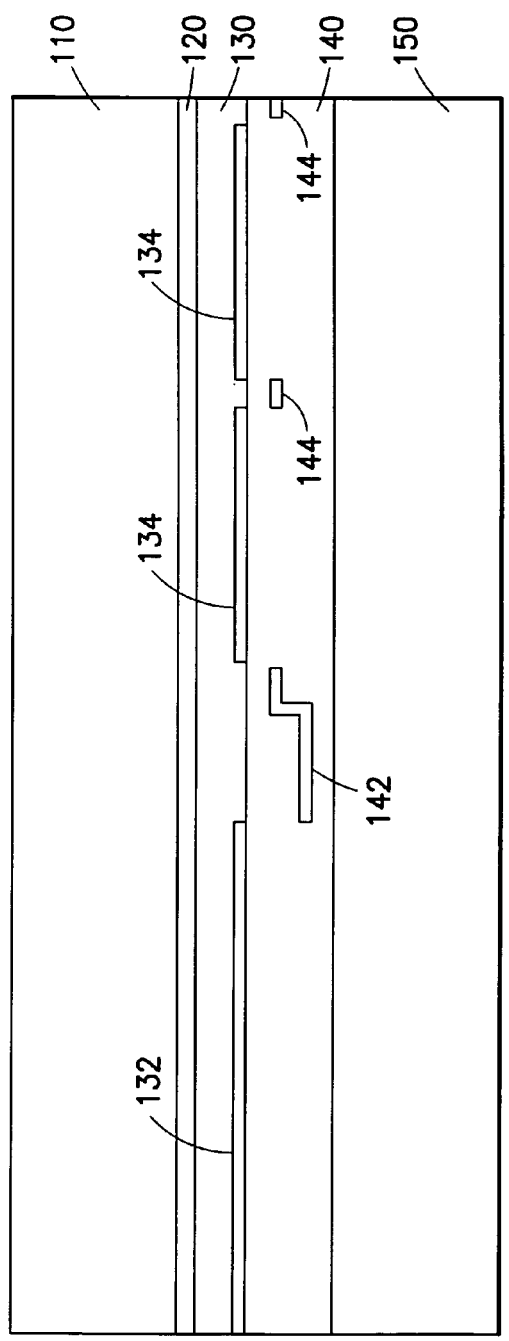
FIG. 3 depicts the process wafer of FIG. 2 after a second handle wafer has been bonded to a field oxide layer of the wafer on the first processing side of the wafer, all in accordance with embodiments of the invention.

FIG. 1 depicts in cross-sectional view a three-layer process wafer 100 comprising a first handle wafer 110; a buried oxide layer 120 and an intrinsic active wafer layer 130. The n-type handle wafer 110 is formed by a Czochralski process (CZ) or a magnetic field applied process (MCZ) and may be up to 700 microns thick. The intrinsic active layer 130 is approximately 10 to 200 microns thick after polishing to its final thickness, and can be formed by a float zone growth method process (FZ).

FIG. 2 depicts the end result of several processing steps performed on the process wafer 100 depicted in FIG. 1. The detector sites 134 are formed by first oxidizing a portion of the intrinsic active wafer layer 130. The oxide layer is then etched to reveal portions of the intrinsic active wafer layer where detector sites will be formed. The detector sites are then formed by ion implantation of boron or other P-type dopant materials such as aluminum or gallium. The front side capture area 132 for the backside contact is also formed by etching and then ion implantation using N-type material like arsenic. A field or second oxide layer 140 is then grown on intrinsic active layer 130. The field oxide layer 140 is etched to expose regions where gate contacts and control gates will be formed. Next, the gate contact 142 and control gates 144 are formed in the etched regions. The gate contacts 142 and control gates can be implemented in metal or polysilicon. Gate contacts and control gate are optional and in alternate embodiments may not be used. Finally, another oxide layer is grown on the field oxide layer 140, gate contact 142 and/or other control gates 144. The resulting modified field oxide layer 140 is then processed to a uniform thickness.

Figure 4:
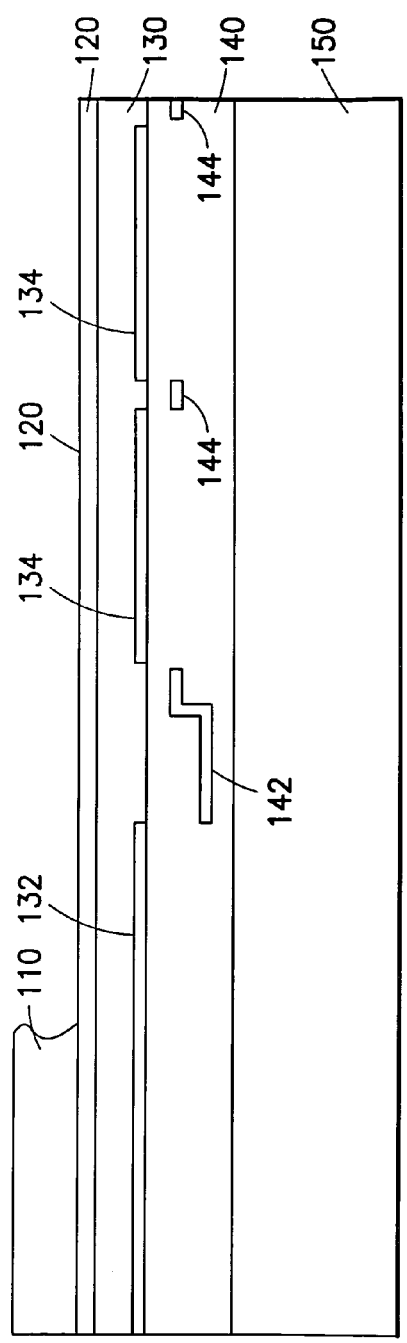
FIG. 4 depicts steps being performed on the first handle wafer of the process wafer depicted in FIG. 3, all in accordance with embodiments of the invention.

FIG. 3 depicts the bonding of the second handle wafer 150 to the oxide layer 140 using an $SiO_2$ bonding process, or other appropriate process. FIG. 4 depicts the removal of the first handle wafer layer 110. The first handle wafer layer 110 is ground to a thickness of 30-50 microns, and the remaining portion of the silicon is then etched to expose the buried oxide layer 120.

FIG. 5 shows the next processing step which forms a portion of the structure that will support the backside contact to the front side field plate. A portion of the intrinsic active wafer layer 130 is etched to reveal the oxide layer 140 formed in the previous step. KOH (potassium hydroxide) anisotropic etching, other anisotropic etching methods (using, for example, Tetra Methyl Ammonia Hydroxide), or plasma oxide etching may be used to form channel 160. The sides of the channel 160 are sloped to accommodate an ion, implantation step in which N-type doping materials will be implanted into the sloped sides to accommodate the front side to backside contact. Other deep contact structures could be used, formed by an inductively coupled plasma or Bosch etch process for silicon through-via made conductive with implants, polysilicon or other means. Other materials may or may not require deep contacts depending on the resistivity of the detector bulk or substrate.

In the next steps depicted in FIG. 6, the buried oxide layer 120 and a portion of the field oxide layer 140 in the channel 160 is removed. FIG. 7 shows the results of one or more steps in which an N+ region 136 is formed by ion implantation in the surface of active intrinsic layer 130. The N+ region extends across the surface of the intrinsic active layer 130 to the channel 160 and down the sloped sides of the channel 160 where it contacts the N+ front side contact capture area 132.

In the next processing step a third handle wafer 170 will be bonded to the second processing side of the process wafer 100. Typically, a bonding oxide layer 138 is grown on the second processing side of the process wafer 100 as shown in FIG. 8. In alternate embodiments of the present invention, an anti-reflection coating (not shown) may be deposited on the intrinsic active layer before the bonding oxide layer is grown on the second processing side of the process wafer. In still further embodiments, the third handle wafer 170 may comprise an optical element; an optically transparent substrate (in the waveband of interest); or an opaque element. FIG. 9 depicts the result of the processing step in which the third handle wafer 170 has been bonded to the second processing side of the process wafer 100.

FIG. 10 depicts the performance of a processing step in which the second handle wafer 150 is being removed. In one embodiment of the present invention, the second handle wafer 150 is ground to about 30-50 microns. Then the remaining portion of the second handle wafer is removed by etching.

Figure 11:
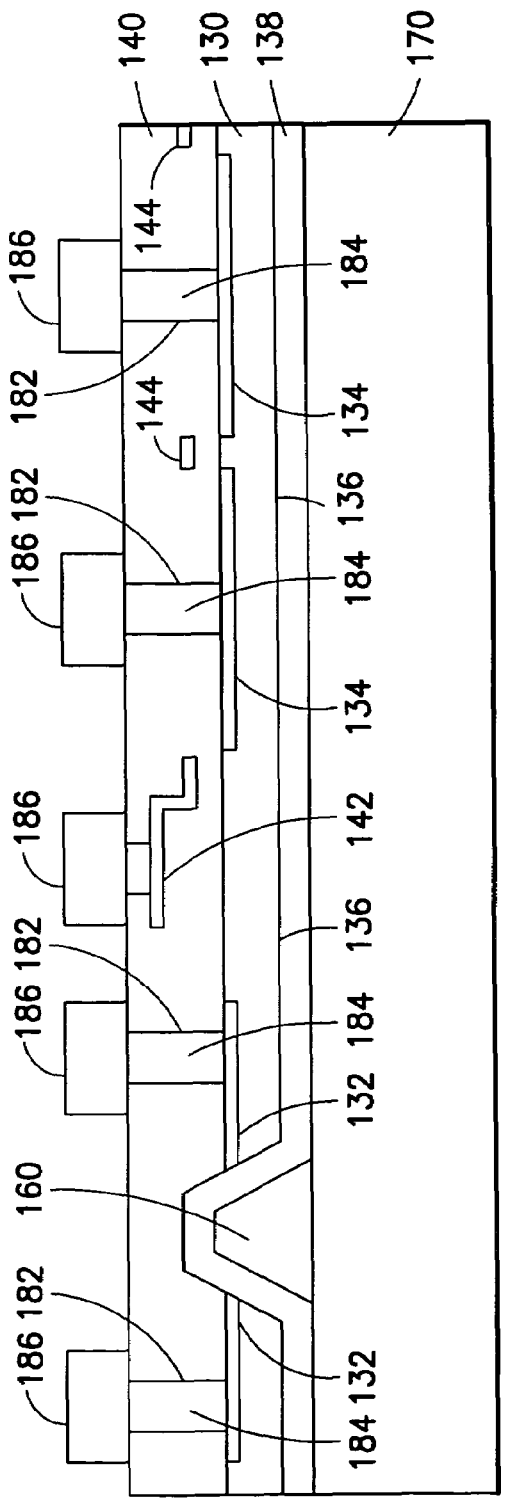
FIG. 11 depicts the results of steps in which metal contacts are formed in the field oxide layer on the first processing side of the process wafer, all in accordance with embodiments of the invention.

FIG. 11 depicts the result of several processing steps. In a first step, photoresist material is deposited and the oxide layer 140 is selectively etched down to the detector regions 134, gate contact area 142 and the N+ front side contact capture area to form cavities 182. Then metal 184 is deposited in the cavities 182 formed by etching, e.g., by sputtering. Then the photoresist mask is removed. Next another oxide layer is grown and selectively etched, and then bump formations 186 are achieved by depositing a bump metallization. The bump formations 186 are in contact with metal regions 184. Other methods of forming contacts between the detector metal and sensor circuits or other components can be used.

Figure 12:
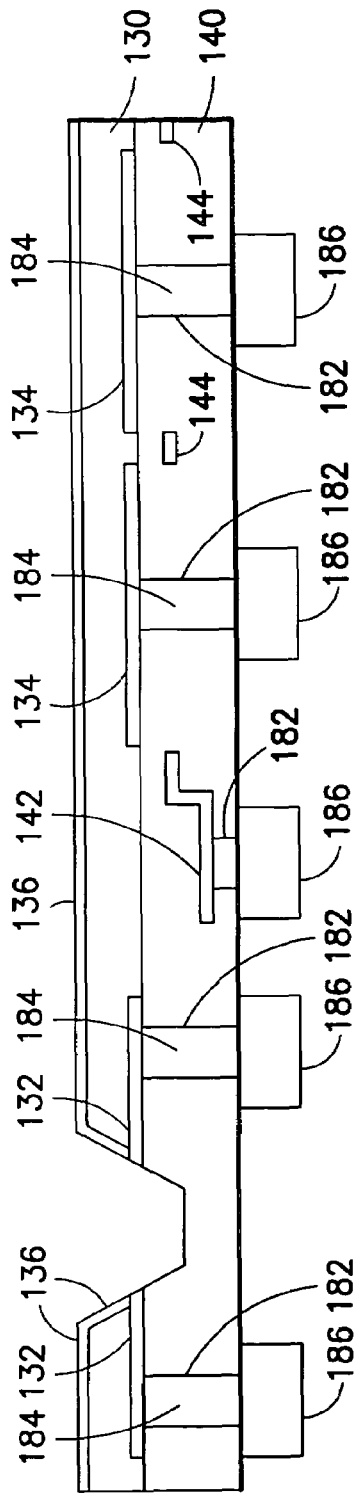
FIG. 12 depicts the results of steps performed on the process wafer of FIG. 11 during which the third handle wafer has been removed.

FIG. 12 depicts the results of additional processing steps. In a further processing step the third handle wafer 170 may be ground to 30-50 microns, and then etched to reveal the intrinsic active layer 130,.

Figure 13:
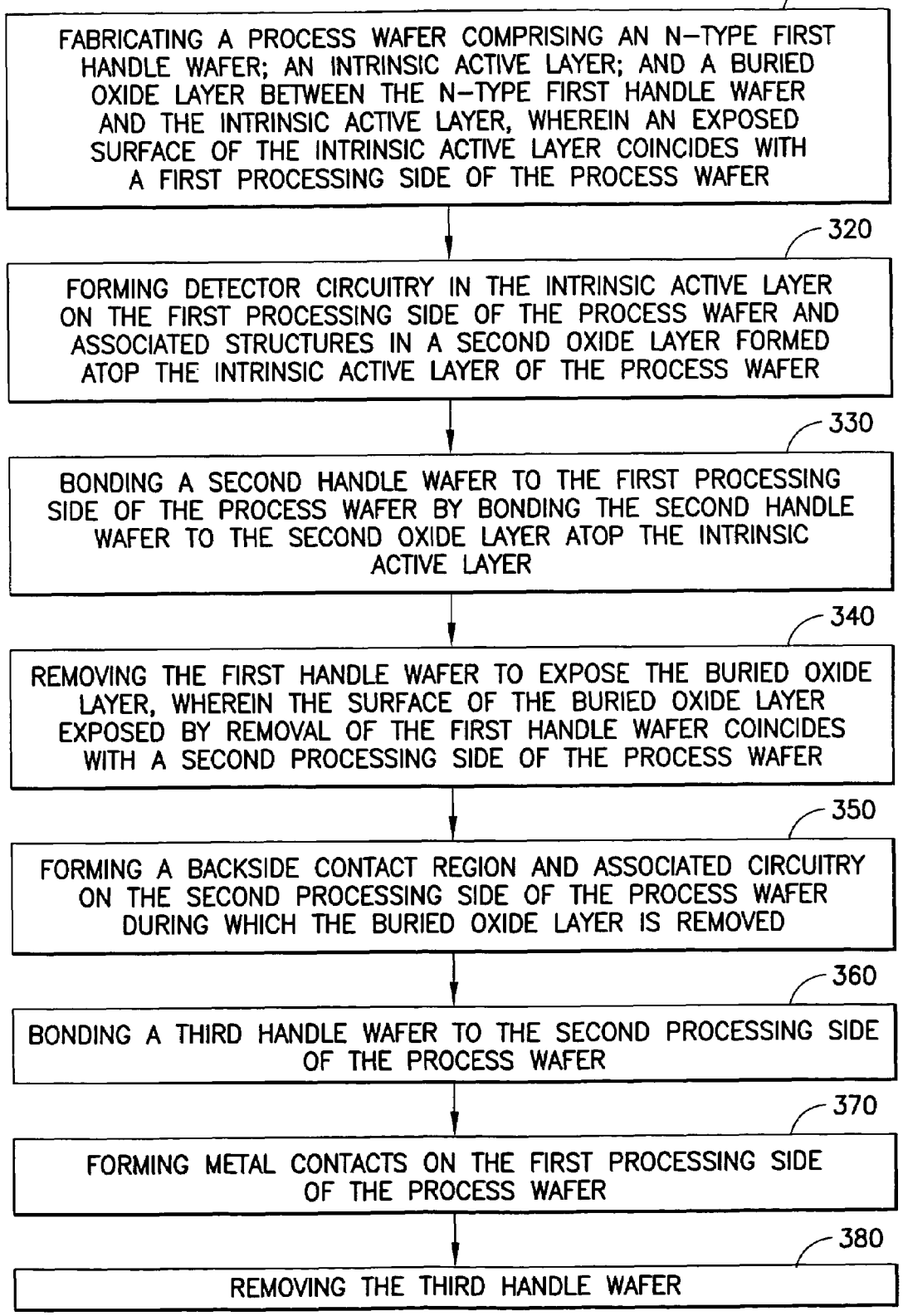
FIG. 13 is a flowchart summarizing the fabrication steps depicted in FIGS. 1-12.

The steps depicted in FIGS. 1-12 are generally summarized in the flow chart depicted in FIG. 13. In the method 300 depicted in FIG. 13 at step 310 a process wafer is fabricated comprising an N-type first handle wafer; an intrinsic active layer; and a buried oxide layer between the N-type first handle wafer and the intrinsic active layer. In the method 300, an exposed surface of the intrinsic active layer coincides with a first processing side of the process wafer. Next, at step 320 detector circuitry is formed in the intrinsic active layer on the first processing side of the process wafer. Associated structures (for example, gate contact areas and control gates are formed in a silicon dioxide layer grown atop the intrinsic active layer.

Then, at step 330 a second handle wafer is bonded to the first processing side of the process wafer by bonding the second handle wafer to the second oxide layer formed atop the active intrinsic layer.

Next steps are performed to form a backside contact region. This is accomplished by removing the first handle wafer to expose the buried oxide layer at step 340. The surface of the buried oxide layer exposed by removal of the first handle wafer coincides with a second processing side of the process wafer. Then at step 350, a backside contact region and associated circuitry are formed on the second processing side of the process wafer. During step 350 the buried oxide layer is removed. Next at step 360 a third handle wafer is bonded to the second processing side of the process wafer. Then, at step 370 metal contacts to the gate contact area, N+ front side contact capture area, and P+ detector sites are formed. Next, at step 380, the third handle wafer is removed.

Figure 14B:
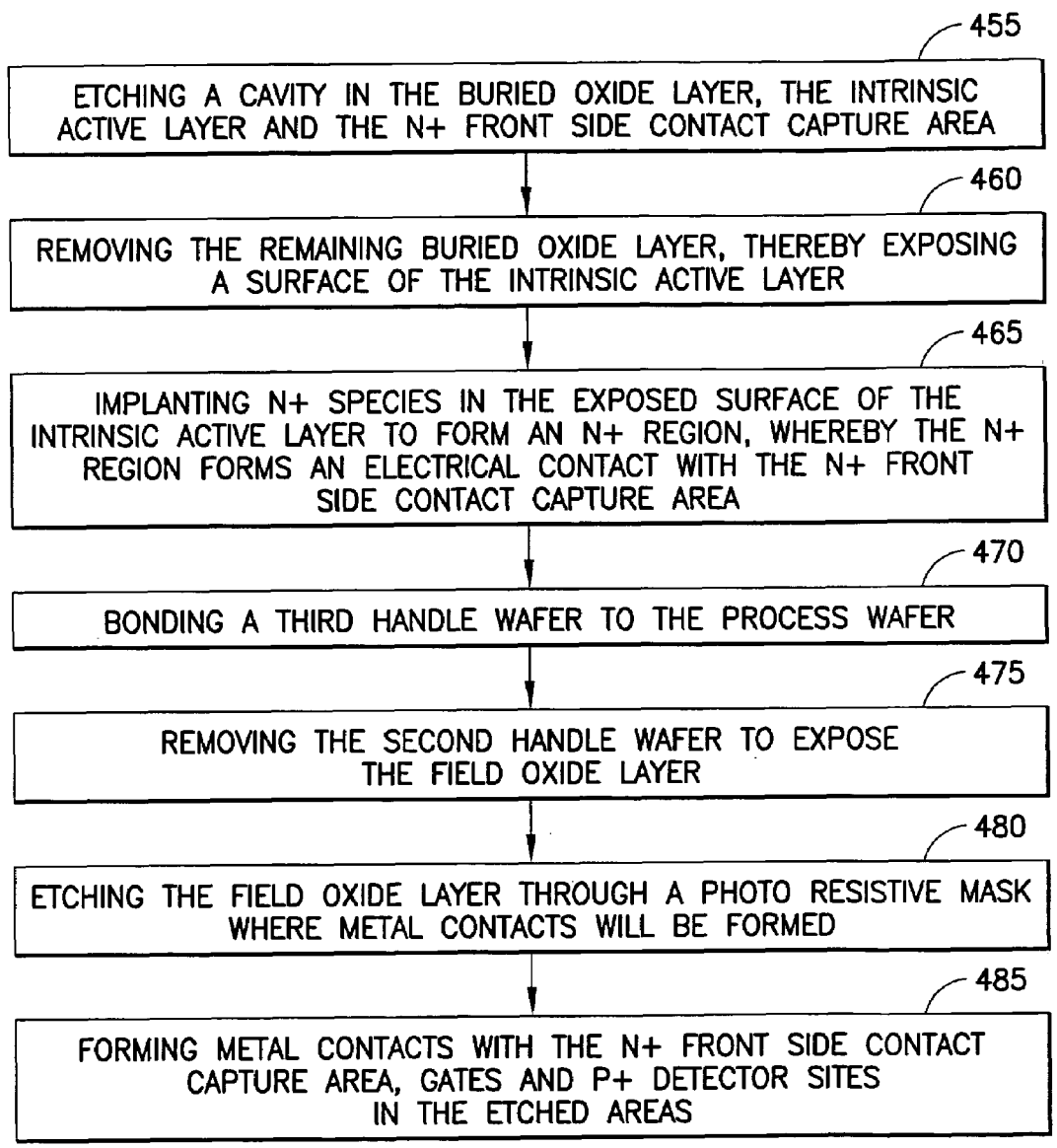
FIG. 14 is a flowchart depicting an alternate method capable of forming a PIN imaging sensor in accordance with embodiments of the present invention.

FIGS. 14A-B depict an alternate method 400 capable of forming a PIN detector device in accordance with embodiments of the present invention. The method 400 operates on process wafer as depicted in FIG. 1. At step 410, P-type material is implanted through a photo-resistive mask to form a regular two-dimensional pattern of non-contiguous P+ detector sites 134 in the intrinsic active layer 130 of the process wafer 100. Next, at step 415 N-type material is implanted through a photo-resistive mask to form an N+ front side capture area 132 in the intrinsic active wafer layer. Then, at step 420 a field oxide layer is grown on the intrinsic active layer. Next, at step 425, the field oxide is etched through a mask to expose regions where gate contact and control gates will be formed. Then, at step 430 the gate contact and control gates are formed. The gate contacts and control gates can be implemented in metal or polysilicon. Following this, at step 435 another oxide layer is formed on the field oxide layer, gate contact and control gates. Then, at step 440, the oxide layer formed on the field oxide layer, gate contact and control gates is processed to a uniform thickness. The results of steps 420-440 are depicted in the process wafer of FIG. 2.

Next, step 445 of method 400 is performed, whereby a second handle wafer is bonded to the oxide layer formed on the field oxide layer, gate contact and control gates. Then, at step 450 the first handle wafer is removed to expose the buried oxide layer 120. Next, at step 455, a cavity 160 is etched in the buried oxide layer, the intrinsic active layer, and the N+ front side contact capture area. Then, at step 460 the remaining buried oxide layer is removed, thereby exposing a surface of the intrinsic active layer. Next, at step 465 N+ species are implanted in the exposed surface of the intrinsic active layer to. form an N+ region. The N+ region forms an electrical contact with the N+ front side contact capture area. Then, at step 470 a third handle wafer is bonded to the process wafer. Next, at step 475, the second handle wafer is removed to expose the field oxide layer. Then, at step 480, the field oxide layer is etched through a photoresistive mask in regions where metal contacts will be formed. The regions coincide with the N+ front side contact capture area, the gate contact area and the detector sites. Next, at step 485 the metal contacts are formed in the etched regions with the N+ front side contact capture area, the gate contact area and the detector sites.

It is also an embodiment of the present invention that the fabrication and removal processes can be stored on an electronic medium, such as RAM (random access memory) ROM (read only memory) or other non-volatile memory (NVM). Thus a computer may be used to implement the invention.

The present invention has been described in terms of steps which may represent a single actual process step, or the combination of multiple process steps. One of ordinary skill in the art will appreciate that the steps of the method of the present invention can be performed in different combinations and sequences then as set forth herein. All such combinations and orderings of steps are within the scope of the present invention. Also, the disclosed sequence of steps is not critical and it is contemplated that one skilled in the art would be aware of modifications in the sequence of steps described herein. In other words, combining steps and modifying the sequence of steps described does not depart from the scope of the invention.

Furthermore, while the present invention has been described in terms of particular materials there are other materials, which may be interchangeable, that should be understood by one skilled in the art to be equivalents. Indeed, the present invention may be accomplished with any combination of materials that achieve a similar result, including a variety of detector materials in place of the intrinsic silicon.

Furthermore, while specific dimensions have been provided to describe the invention, it is contemplated that one of ordinary skill in the art may modify the dimensions without departing from the invention.

Thus it is seen that the foregoing description has provided by way of exemplary and non-limiting examples a full and informative description of the best method and apparatus presently contemplated by the inventors for fabricating a triple-bonded PIN focal plane structure. One skilled in the art will appreciate that the various embodiments described herein can be practiced individually; in combination with one or more other embodiments described herein; or in combination with fabrications methods differing from those described herein. Further, one skilled in the art will appreciate that the present invention can be practiced by other than the described embodiments; that these described embodiments are presented for the purposes of illustration and not of limitation; and that the present invention is therefore limited only by the claims which follow.

We claim:
1. A method for fabricating a p-type/intrinsic/n-type (PIN) focal plane imaging sensor detector component comprising:
fabricating a process wafer comprising an n-type first handle layer; an intrinsic active layer; and a buried oxide layer between the n-type first handle layer and the intrinsic active layer, wherein an exposed surface of the intrinsic active layer coincides with a first processing side of the process wafer;

forming an N+ front side contact capture area and P+ detector circuitry in the intrinsic active layer on the first processing side of the process wafer and associated structures in a second oxide layer atop the intrinsic active layer of the process wafer;

bonding a second handle wafer to the first processing side of the process wafer by bonding the second handle wafer to the second oxide layer atop the intrinsic active layer;

removing the n-type first handle layer to expose the buried oxide layer, wherein the surface of the buried oxide layer exposed by removal of the n-type first handle layer coincides with a second processing side of the process wafer;

forming a backside contact region on the second processing side of the process wafer, during which the buried oxide layer and a portion of the intrinsic active layer above the N+ front side contact capture area is removed thereby exposing a surface of the active intrinsic layer and a portion of the N+ front side capture area;

implanting N+ species in the exposed surface of the active intrinsic layer to form an N+ region, whereby the N+ region forms an electrical contact with the N+ front side contact capture area;

bonding a third handle wafer to the second processing side of the process wafer;

removing the second handle wafer to expose the second oxide layer, wherein the surface of the second oxide layer exposed by removal of the second handle wafer coincides with the first processing side of the process wafer; and forming metal contacts on the first processing side of the process wafer with the N+ front side contact capture area, P+ detectors and associated structures.

2. The method of claim 1 where the third handle wafer comprises an optical element.

3. The method of claim 2 where the optical element comprises a ceramic material.

4. The method of claim 1 further comprising removing the third handle wafer.

5. The method of claim 1 where the n-type first handle layer is removed by grinding.

6. The method of claim 1 where removing the n-type first handle layer further comprises:
grinding a portion of the thickness of the n-type first handle layer, leaving a portion of the n-type first handle layer remaining;
removing the remaining portion of the n-type first handle layer by etching to expose the buried oxide layer.

7. The method of claim 1 where forming a backside contact region further comprises:
etching a cavity through the buried oxide layer, the intrinsic active layer, an N+ region and the second oxide layer.

8. The method of claim 7 where the sides of the cavity are sloped.

9. The method of claim 8 whereby the N+ region formed in the surface of the active intrinsic layer coincides with a front plane of the PN focal plane imaging sensor formed by the method, and where the N+ region formed in the active intrinsic layer has a backside contact provided by the N+ front side contact capture region formed in the active intrinsic layer.

10. The method of claim 1 where bonding a third handle wafer to the second processing side of the process wafer further comprises the initial step of:

applying an anti-reflection coating to the second processing side of the process wafer.

11. The method of claim 10 where bonding a third handle wafer to the second processing side of the process wafer further comprises the additional initial step of:
forming a bonding oxide layer on the anti-reflection coating applied to the second processing side of the process wafer.

12. The method of claim 1 where the second handle wafer is removed by grinding.

13. The method of claim 1 where removing the second handle wafer to expose the second oxide layer further comprises:
grinding a portion of the thickness of the second handle wafer, leaving a portion of the second handle wafer remaining; and
removing the remaining portion of the second handle wafer by etching to expose the second oxide layer.

14. The method of claim 1 wherein the associated structures comprise gate contacts and control gates.

15. The method of claim 14 wherein the gate contacts and control gates are fabricated in polysilicon material.

16. The method of claim 14 wherein the gate contacts and control gates are fabricated in a metallic material.

17. A p-type/intrinsic/n-type (PIN) focal plane imaging sensor detector component created by a process comprising:
fabricating a process wafer comprising an n-type first handle layer; an intrinsic active layer; and a buried oxide layer between the n-type first handle layer and the intrinsic active layer, wherein an exposed surface of the intrinsic active layer coincides with a first processing side of the process wafer;

forming an N+ front side contact capture area and P+ detector circuitry in the intrinsic active layer on the first processing side of the process wafer and associated structures in a second oxide layer atop the intrinsic active layer of the process wafer;

bonding a second handle wafer to the first processing side of the process wafer by bonding the second handle wafer to the second oxide layer atop the intrinsic active layer;

removing the n-type first handle layer to expose the buried oxide layer, wherein the surface of the buried oxide layer exposed by removal of the n-type first handle layer coincides with a second processing side of the process wafer;

forming a backside contact region on the second processing side of the process wafer, during which the buried oxide layer and a portion of the intrinsic active layer above the N+ front side contact capture area is removed thereby exposing a surface of the active intrinsic layer and a portion of the N+ front side capture area;

implanting N+ species in the exposed surface of the active intrinsic layer, whereby the N+ region forms an electrical contact with the N+ front side contact capture area;

bonding a third handle wafer to the second processing side of the process wafer;

removing the second handle wafer to expose the second oxide layer, wherein the surface of the second oxide layer exposed by removal of the second handle wafer coincides with the first processing side of the process wafer; and forming metal contacts on the first processing side of the process wafer with the N+ front side contact capture area; P+ detectors and associated structures.

18. A method, comprising:
processing a three-layer process wafer to form a p-type/intrinsic/n-type (PIN) imaging device detector component using three handle wafers, the three-layer process wafer comprising a first handle wafer of N-type material, an intrinsic active layer, and a buried oxide layer positioned between the first handle wafer and the intrinsic active layer, the method for processing comprising:

implanting P-type material though a photo-resistive mask to form a regular two-dimensional pattern of non-contiguous P+ detector sites in the intrinsic active layer of the process wafer;

implanting N-type material through a photo-resistive mask to form an N+ front side contact capture area in the intrinsic active layer;

growing a field oxide on the intrinsic active layer;

etching the field oxide to expose regions where gate contact and control gates will be formed in the field oxide;

forming the gate contact and control gates;

forming an oxide layer on the field oxide layer, gate contact and control gates;

processing the oxide layer formed on the field oxide layer, gate contact and control gates to a uniform thickness;

bonding a second handle wafer to the oxide layer formed on the field oxide layer, gate contact and control gates;

removing the first handle wafer to expose the buried oxide layer;

etching a cavity in the buried oxide layer, the intrinsic active layer and the N front side contact capture area;

removing the remaining buried oxide layer, thereby exposing a surface of the intrinsic active layer;

implanting N+ species in the exposed surface of the intrinsic active layer to form an N region, whereby the N+ region forms an electrical contact with the N+ front side contact capture area;

bonding a third handle wafer to the process wafer;

removing the second handle wafer to expose the field oxide layer;

etching the field oxide layer through a photoresistive mask where metal contacts will be formed; and forming metal contacts with the N+ front side contact capture area; gate contacts and P+ detector sites in the etched areas.

19. The method of claim 18 where the third handle wafer comprise an optical element.

20. The method of claim 18 further comprising removing the third handle wafer.

21. The method of claim 18 wherein the gate contacts and control gates are fabricated in polysilicon material.

22. The method of claim 18 wherein the gate contacts and control gates are fabricated in a metallic material.

* * * * *